United States Patent
Petrov et al.

(10) Patent No.: US 12,441,673 B2
(45) Date of Patent: Oct. 14, 2025

(54) CATALYSED SYNTHESIS OF FLUORINATED ALKENES AND FLUORINATED ALKENE COMPOSITIONS

(71) Applicant: THE CHEMOURS COMPANY FC, LLC, Wilmington, DE (US)

(72) Inventors: Viacheslav A. Petrov, Hockessin, DE (US); Jason R. Juhasz, Hockessin, DE (US); Luke David Simoni, Wilmington, DE (US); Drew Richard Brandt, West Chester, PA (US); Jonathan P Stehman, Wilmington, DE (US)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 816 days.

(21) Appl. No.: 17/774,278

(22) PCT Filed: Dec. 9, 2020

(86) PCT No.: PCT/US2020/063932
§ 371 (c)(1),
(2) Date: May 4, 2022

(87) PCT Pub. No.: WO2021/119078
PCT Pub. Date: Jun. 17, 2021

(65) Prior Publication Data
US 2022/0388929 A1    Dec. 8, 2022

Related U.S. Application Data

(60) Provisional application No. 62/945,388, filed on Dec. 9, 2019.

(51) Int. Cl.
*C07C 17/278*    (2006.01)
*C09K 5/10*    (2006.01)
(Continued)

(52) U.S. Cl.
CPC ............. *C07C 17/278* (2013.01); *C09K 5/10* (2013.01); *H01M 10/613* (2015.04); *H01M 10/6567* (2015.04); *H05K 7/203* (2013.01)

(58) Field of Classification Search
CPC ...... C07C 17/278; C07C 21/18; C07C 21/185
See application file for complete search history.

(56) References Cited

U.S. PATENT DOCUMENTS

| | | |
|---|---|---|
| 2010/0154419 A1 | 6/2010 | Kontomaris |
| 2013/0098396 A1 | 4/2013 | Lousenberg et al. |
| 2018/0288906 A1 | 10/2018 | Hopton et al. |

FOREIGN PATENT DOCUMENTS

| | | |
|---|---|---|
| WO | 2008057513 A1 | 5/2008 |
| WO | 2010080467 A2 | 7/2010 |

(Continued)

OTHER PUBLICATIONS

PCT International Search Report and Written Opinion for Application No. PCT/US2020/063932 mailed Mar. 15, 2021.

(Continued)

*Primary Examiner* — Jafar F Parsa

(57) ABSTRACT

A method of producing a fluoroolefin includes contacting a compound of formula (1), $R_fCX_1\!=\!CHCF_3$, with a fluorinated ethylene compound of formula (2), $CX_2X_3\!=\!CX_4X_5$ in the presence of a catalyst. In the compound of formula (1), $R_f$ is a linear or branched $C_1$-$C_{10}$ perfluorinated alkyl group and $X_1$ is H, Br, Cl, or F. In the compound of formula (2), $X_2$, $X_3$, $X_4$, and $X_5$ are each independently H, Br, Cl, or F and at least three of $X_2$, $X_3$, $X_4$, and $X_5$ are F. The resulting composition comprises a compound of formula (3), $R_f(CF_2)_nCX_6\!=\!CH(CF_2)_mCX_7X_8CFX_9X_{10}$. In the compound of formula (3), $X_6$, $X_7$, $X_8$, $X_9$, and $X_{10}$ are each independently H, Br, Cl, or F, and the total number of each of H, Br, Cl, and F corresponds to the total number of each (Continued)

of H, Br, Cl, and F provided by the compounds of formulae (1) and (2).

15 Claims, 1 Drawing Sheet

(51) Int. Cl.
  *H01M 10/613* (2014.01)
  *H01M 10/6567* (2014.01)
  *H05K 7/20* (2006.01)

(56) References Cited

FOREIGN PATENT DOCUMENTS

WO 2017055877 A1 4/2017
WO 2018179162 A1 10/2018

OTHER PUBLICATIONS

Standard Test Method for Concentration Limits of Flammability of Chemicals (Vapors and Gases), ASTM International E681-09 (Reapproved 2015), West Conshohocken, Pennsylvania.
Standard Test Method for Kinematic Viscosity of Transparent and Opaque Liquids (and Calculation of Dynamic Viscosity), ASTM International, Designation: D445-18, West Conshohocken, Pennsylvania 2015.

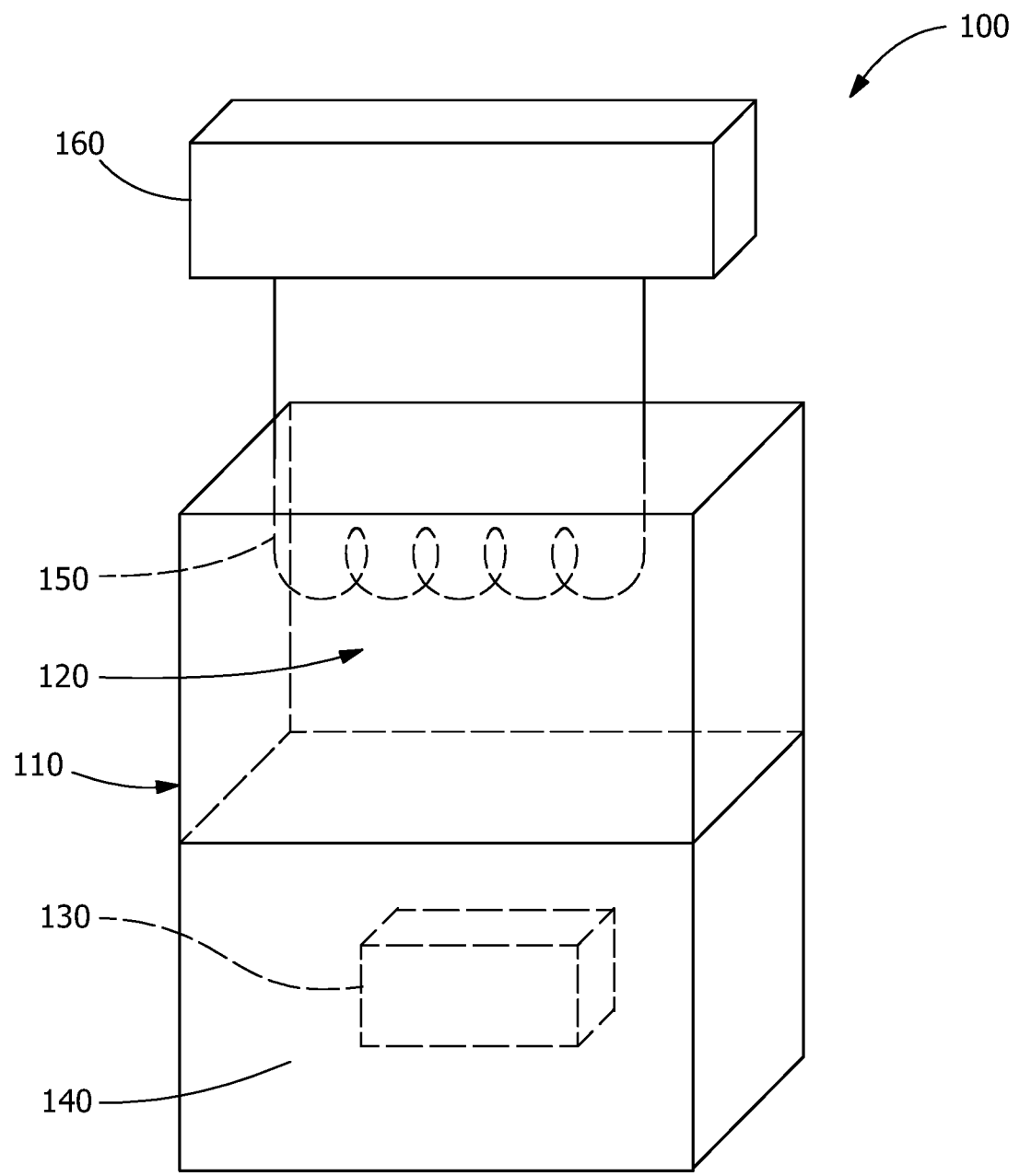

CATALYSED SYNTHESIS OF FLUORINATED ALKENES AND FLUORINATED ALKENE COMPOSITIONS

This application claims the benefit of U.S. Application No. 62/945,388, filed Dec. 9, 2019. The disclosure of Application No. 62/945,388 is hereby incorporated by reference.

FIELD

The present invention is directed to the production of fluorinated alkene compounds and fluorinated alkene compositions.

BACKGROUND

Uncertainty in energy supplies and prices and a growing public awareness of the environmental impacts from the extraction, transportation and use of fossil fuels are motivating a renewed interest in low temperature heat utilization (i.e., heat at temperatures lower than about 300° C.). Such heat may be extracted from various commercial, industrial or natural sources. Elevation of the temperature of available heat through high temperature mechanical compression heat pumps (HTHPs) to meet heating requirements and conversion of the available heat to mechanical or electrical power through Organic Rankine Cycles (ORCs) are two promising approaches for the utilization of low temperature heat.

ORCs and HTHPs require the use of working fluids. Working fluids with high global warming potentials (GWPs) currently in common use for HTHPs and ORCs (e.g. HFC-245fa) have been under increasing scrutiny, culminating in the landmark HFC amendment to the Montreal Protocol recently agreed upon in Kigali, Rwanda. Clearly, there is an increasing need for more environmentally sustainable working fluids for HTHPs and ORCs, especially given that environmental sustainability is a primary motivation for low temperature heat utilization. More specifically, there is a need for low GWP working fluids with boiling points higher than about 50 degrees Celsius (hereinafter "° C.") that are particularly suitable for conversion of heat available at temperatures approaching or exceeding 200° C. to power and for heating at temperatures approaching 200° C. from heat available at lower temperatures.

Other areas for use exist for direct contact with electrified components. These fluids typically exhibit very low dielectric constants which means that they do not conduct and as such could provide heat transfer in various applications, including immersion cooling and phase change cooling (e.g., of electronics, including data center cooling). Additional application as insulating gas also exist due to the extremely low dielectric constant values. Inherently, liquid dielectric values for a fluid also shown to exhibit even lower dielectric values in the gas phase.

These fluids also offer use in general heat transfer application which can utilize forced convection and/or phase change as a mechanism to displace heat from hot source to a cold source or for the reverse (cold to hot source). Applications can include heat pipes, refrigeration, and/or any convective heat transfer system.

These fluids can also be used as solvents to remove contaminants or particles away from a given surface or structure, as carrier fluids where the desired product would be deposited and said fluid evaporates away, and as a medium for fire extinguishant as a nonflammable agent that suppresses or displace the chemical reaction.

Fluoroalkenes, such as, HFO-163-12mczz ($C_2F_5CH=CHC_3F_7$) can be prepared using F-heptene-3 starting material using a four-step preparation, including sequential hydrogenation/dehydrofluorination process. However, this process is lengthy and is based on relatively expensive starting materials (F-heptene is made using the reaction of hexafluoropropene (HFP) and 2 moles of tetrafluoroethene (TFE)).

WO 2008/057513 describes a process for the preparation of internal dihydrofluoroolefins of the formula $RCH=CHC2F_5$, comprising reacting a fluorinated olefin of the RCH=CHF, wherein R is selected from perfluoroalkyl groups having from one to ten carbon atoms, and the said alkyl group is either an n-alkyl chain, a sec-alkyl chain, or an iso-alkyl chain, in the liquid phase with tetrafluoroethylene, in the presence of an antimony pentafluoride ($SbF_5$), removing the Lewis acid catalyst and isolating the dihydrofluoroolefin. The disclosure of WO 2008/057513 is hereby incorporated by reference.

SUMMARY

In an embodiment, a method of producing a fluoroolefin includes contacting a compound of formula (1), $R_fCX_1=CHCF_3$ (1) wherein $R_f$ is a linear or branched $C_1$-$C_{10}$ perfluorinated or polyfluorinated alkyl group; and wherein $X_1$ is H, Br, Cl, or F; with a fluorinated ethylene compound of formula (2), $CX_2X_3=CX_4X_5$ (2). In the compound of formula (2) $X_2$, $X_3$, $X_4$, and $X_5$ are each independently H, Br, Cl, or F; and at least three of $X_2$, $X_3$, $X_4$, and $X_5$ are F. The contacting is performed in the presence of a catalyst in an amount sufficient to form a composition comprising a compound of formula (3), $R_f(CF_2)_nCX_6=CH(CF_2)_mCX_7X_8CFX_9X_{10}$ (3). In the compound of formula (3) n is an integer from 0 to 10; and m is an integer from 1 to 10; In the compound of formula (3) $X_6$, $X_7$, $X_8$, $X_9$, and $X_{10}$ are each independently H, Br, Cl, or F; and the total number of each of H, Br, Cl, and F represented by $X_6$, $X_7$, $X_8$, and $X_9$ is the same as the total number of each of H, Br, Cl, and F provided by $X_1$, $X_2$, $X_3$, $X_4$, and $X_5$ in formulae (1) and (2).

The present invention includes the following aspects and embodiments:

In one embodiment, disclosed herein are methods of producing a fluoroolefin. The methods described herein comprise: contacting a compound of formula (1), $R_fCX_1=CHCF_3$ (1) wherein $R_f$ is a linear or branched $C_1$-$C_{10}$ perfluorinated or polyfluorinated alkyl group; and wherein $X_1$ is H, Cl, or F; with a fluorinated ethylene compound of formula (2), $CX_2X_3=CX_4X_5$ (2). In the compound of formula (2) $X_2$, $X_3$, $X_4$, and $X_5$ are each independently H, Cl, or F; and at least three of $X_2$, $X_3$, $X_4$, and $X_5$ are F. The contacting is performed in the presence of a catalyst in an amount sufficient to form a composition comprising a compound of formula (3), $R_f(CF_2)_nCX_6=CH(CF_2)_mCX_7X_8CFX_9X_{10}$ (3) wherein n is an integer from 0 to 10; wherein m is an integer from 1 to 10; wherein $X_6$, $X_7$, $X_8$, $X_9$, and $X_{10}$ are each independently H, Cl, or F; and wherein the total number of each of H, Cl, and F represented by $X_6$, $X_7$, $X_8$, $X_9$, and $X_{10}$ is the same as the total number of each of H, Cl, and F provided by $X_1$, $X_2$, $X_3$, $X_4$, and $X_5$ in formulae (1) and (2).

According to any of the foregoing embodiments, also disclosed herein are methods wherein $R_f$ is selected from the group consisting of $CF_3$, $C_2F_5$, $C_3F_7$, i-$C_3F_7$, $C_4F_9$, $C_5F_{11}$, i-$C_5F_{11}$, $C_6F_{13}$, and i-$C_6F_{13}$.

According to any of the foregoing embodiments, also disclosed herein are methods wherein the compound of formula (1) includes $C_4F_9CH=CHCF_3$, $(CF_3)_2CFCH=CHCF_3$, $CF_3CH=CFCF_3$, or $CF_3CH=CClCF_3$; and the compound of formula (3) includes $C_4F_9CH=CHCF_2CFClCF_3$, $C_4F_9CH=CHCF_2CF_2CF_2Cl$, $(CF_3)_2CFCH=CHCF_2CFClCF_3$, $(CF_3)_2CFCH=CHCF_2CF_2CF_2Cl$, $C_2F_5CH=CHC_2F_5$, $C_2F_5CF=CHCFClCF_3$, $C_2F_5CF=CHCF_2CF_2Cl$, or $C_3F_7CH=CClCF_3$.

According to any of the foregoing embodiments, also disclosed herein are methods wherein the fluorinated ethylene of formula (2) comprises at least one of $CF_2=CF_2$, $CFCl=CF_2$; $CFCl=CFCl$, $CFH=CF_2$ (HFO-1123), $CFH=CFH$ (HFO-1132, and $CF_2=CH_2$ (VF2) and the composition comprises at least one member selected from the group consisting of $C_4F_9CH=CHCF_2CFClCF_3$, $C_4F_9CH=CHCF_2CF_2CF_2Cl$, $(CF_3)_2CFCH=CHCF_2CFClCF_3$, $(CF_3)_2CFCH=CHCF_2CF_2CF_2Cl$, $C_2F_5CH=CHC_2F_5$, $C_2F_5CF=CHCFClCF_3$, $C_2F_5CF=CHCF_2CF_2Cl$, or $C_3F_7CH=CClCF_3$, and $CF_3CF=CHCFClCF_2Cl$.

According to any of the foregoing embodiments, also disclosed herein are methods wherein the amount sufficient includes a molar ratio of (TFE):the compound of formula (1) of 0.01:1 to 5:1.

According to any of the foregoing embodiments, also disclosed herein are methods wherein the amount sufficient includes a molar ratio of (TFE):the compound of formula (1) of 0.1:1 to 2:1.

According to any of the foregoing embodiments, also disclosed herein are methods wherein the amount sufficient includes a molar ration of the compound of formula (2) and the compound of formula (1) of 0.01:1 to 5:1.

According to any of the foregoing embodiments, also disclosed herein are methods wherein the composition further includes a solvent.

According to any of the foregoing embodiments, also disclosed herein are methods wherein the solvent is a perfluorinated saturated compound.

According to any of the foregoing embodiments, also disclosed herein are methods wherein the perfluorinated saturated compound is selected from the group insisting of perfluoropentane, perfluorohexane, cyclic dimer of hexafluoropropene, (mixture of perfluoro-1,2- and perfluoro-1,3-dimethylcyclobutanes), and combinations thereof.

According to any of the foregoing embodiments, also disclosed herein are methods wherein the catalyst includes antimony pentafluoride ($SbF_5$) or a compound of formula (4), $SbCl_xF_{5-x}$ wherein x=0.01 to 0.5.

According to any of the foregoing embodiments, also disclosed herein are methods wherein the catalyst includes aluminum chloride ($AlCl_3$), or antimony pentafluoride ($SbF_5$), or aluminum chlorofluoride $AlCl_xF_{3-x}$.

According to any of the foregoing embodiments, also disclosed herein are methods wherein $R_f$ is a linear or branched $C_2$-$C_{10}$ perfluorinated alkyl group.

According to any of the foregoing embodiments, also disclosed herein are methods wherein $R_f$ is $CF_3$, $C_2F_5$, $C_3F_7$, i$C_3F_7$, $C_4F_9$, $C_5F_{11}$, i-$C_5F_{11}$, $C_6F_{13}$ or i-$C_6F_{13}$.

According to any of the foregoing embodiments, also disclosed herein are methods wherein the contacting is performed at sub-ambient or ambient temperature.

According to any of the foregoing embodiments, also disclosed herein are methods wherein the reaction is conducted under autogenic pressure.

According to any of the foregoing embodiments, also disclosed herein are methods wherein the reaction is conducted at 0.1 to 300 psig.

According to any of the foregoing embodiments, also disclosed herein are methods wherein the reaction is conducted in a closed system.

According to any of the foregoing embodiments, also disclosed herein are methods wherein the contacting is performed at a temperature of −50° C. to 50° C.

According to any of the foregoing embodiments, also disclosed herein are compositions formed by any of the foregoing methods.

According to any of the foregoing embodiments, also disclosed herein are methods for transferring heat from an electronic component comprising providing an immersion cell having at least one electronic component and introducing the inventive composition into the immersion cell wherein the composition at least partially immerses the electronic component.

According to any of the foregoing embodiments, also disclosed herein are methods for transferring heat from an electronic component that comprises at least one of an automotive battery, a computer or server.

According to any of the foregoing embodiments, also disclosed herein are use of the inventive compositions for removing heat from an electronic component.

The embodiments of the invention can be used alone or in combinations with each other. Other features and advantages of the present invention will be apparent from the following more detailed description, taken in conjunction with the accompanying drawings which illustrate, by way of example, the principles of the invention.

BRIEF DESCRIPTION OF THE DRAWING

FIG. 1 illustrates on embodiment of the invention wherein the inventive composition is employed in an immersion cooling system.

DETAILED DESCRIPTION

Provided is a one-step synthesis for the production of fluorinated alkenes, which overcomes the limitations described above.

Embodiments of the present disclosure, for example, in comparison to concepts failing to include one or more of the features disclosed herein, provide a one-step synthesis for the production of fluorinated alkenes. More specifically, the present disclosure provides a one-step synthesis for the production of fluorinated alkenes having a perfluorinated alkyl chain. The resulting fluorinated alkenes are non-conductive and exhibit low liquid viscosities. Embodiments of the present disclosure comprise compositions that have a 0 Ozone Depletion Potential (ODP), are non-flammable (when measured in accordance with ASTM E681) and have a GWP of less than 150, less than 10 and in some cases less than about 1.

The process may be conducted in any reactor suitable for a vapor phase fluorination reaction. The reactor is made of a material that is resistant to the reactants employed. The reactor may be constructed from materials which are resistant to the corrosive effects of hydrogen fluoride such as stainless steel, Hastelloy®, Inconel®, Monel®, gold or gold-lined or quartz. The reactions may be conducted batchwise, continuous, semi-continuous or combinations thereof. Suitable reactors include batch reactor vessels and tubular reactors.

In an embodiment a compound of formula (1), $$R_fCX_1=CHCF_3 \quad (1)$$

wherein $R_f$ is a linear or branched $C_1$-$C_{10}$ perfluorinated alkyl group; and
wherein $X_1$ is H, Br, Cl, or F;
is charged to a reactor, heated, and contacted, in the presence of a catalyst, with a fluorinated ethylene compound of formula (2), $$CX_2X_3=CX_4X_5 \quad (2)$$

wherein $X_2$, $X_3$, $X_4$, and $X_5$ are each independently H, Br, Cl, or F; and
wherein at least three of $X_2$, $X_3$, $X_4$, and $X_5$ are F.

The temperature and pressure of the reactor are maintained at levels sufficient to effect, in the presence of a catalyst, the formation of a composition comprising a compound of formula (3), $$R_f(CF_2)_nCX_6=CH(CF_2)_mCX_7X_8CFX_9X_{10} \quad (3)$$

wherein n is an integer from 0 to 10;
wherein m is an integer from 1 to 10;
wherein $X_6$, $X_7$, $X_8$, $X_9$, and $X_{10}$ are each independently H, Br, Cl, or F; and
wherein the total number of each of H, Br, Cl, and F represented by $X_6$, $X_7$, $X_8$, $X_9$, and $X_{10}$ is the same as the total number of each of H, Br, Cl, and F provided by $X_1$, $X_2$, $X_3$, $X_4$, and $X_5$ in formulae (1) and (2).

In some embodiments, the number of carbons present in formulae (3) is the summation of the carbons present in formula (1) and (2). In some embodiments, the reaction product of formula (3) can further react with the compound of formulae (1) and/or (2) to produce a second compound of formulae (3) wherein the number of carbons present in the second formulae (3) compound is the summation of the carbons present in the first formulae (3) product plus the number of formulae (2) carbons.

In some embodiments, the ratio of formulae (1) to formulae (2) compounds is about 1:1 and, in some cases, about to 1:1 to about 1:2. In the event the ratio of formulae (1) to formulae (2) compounds is greater than about 1:1, then the number of formulae (3) compounds as well as the carbon atoms present in formulae (3) compounds also increases.

In some embodiments, the compound of formula (1) includes $C_4F_9CH=CHCF_3$ $(CF_3)_2CFCH=CHCF_3$, $CF_3CH=CFCF_3$ (HFO-1327), or $CF_3CH=CClCF_3$ (HFO-1326). In one embodiment, the compound of formula (1) includes $CF_3CH=CHF$ (1234ze). In some embodiments, $R_f$ may be a linear or branched perfluorinated or polyfluorinated alkyl group. In some embodiments, $R_f$ may be $CF_3$, $C_2F_5$, $C_3F_7$, i-$C_3F_7$, $C_4F_9$, $C_5F_{11}$, i-$C_5F_{11}$, $C_6F_{13}$ or i-$C_6F_{13}$.

In some embodiments, the fluorinated ethylene of formula (2) includes at least one of tetrafluoro-ethene, $CF_2=CF_2$ (TFE) or $CFCl=CF_2$ (1-chloro-1,2,2-trifluoro-ethene or CTFE). In one embodiment, the fluorinated ethylene of formula (2) includes tetrafluoro-ethene, $CF_2=CF_2$ (TFE). In another embodiment, the fluorinated ethylene of formulae (2) includes CTFE. When CTFE is employed as a formulae (2) compound, formulae (3) will include two isomers.

In one embodiment, the compound of formula (1) includes $CF_3CH=CFCF_3$ (HFO-1327) and the fluorinated ethylene of formula (2) includes $CF_2=CF_2$ (TFE). The reaction of $CF_3CH=CFCF_3$ (HFO-1327) and $CF_2=CF_2$ (TFE) may result in the formation of the composition including $C_2F_5CH=CHC_2F_5$ (HFO-153-10mczz).

The $C_2F_5CH=CHC_2F_5$ (HFO-153-10mczz) may be isolated and optionally purified prior to use. Suitable uses of $C_2F_5CH=CHC_2F_5$ (HFO-153-10mczz) include, but are not limited to, working fluids in systems utilizing a thermodynamic cyclic, a reactive intermediate, a heat transfer fluid with or without phase change, and a solvent.

In some embodiments, fluorinated ethylene of formula (2) may include a plurality of compounds of formula (2). The resulting compound of formula (3) may include a plurality of compounds of formula (3). In one embodiment, the fluorinated ethylene of formula (2) may include tetrafluoroethene, $CF_2=CF_2$ (TFE) and 1-chloro-1,2,2-trifluoroethene. The number of formulae (3) compounds and the number of carbons present in each formulae (3) compound will vary as a function of the ratio of formulae (1) to formulae (2) compounds.

In some embodiments, the resulting compound of formula (3) may include at least one of $C_2F_5CH=CFC_2F_5$ (HFO-152-11mcyz), $CF_3CF=CHCF_2CF_2CF_3$ (HFO-152-11myz), $C_4F_9CH=CHCF_2CF_2CF_2Cl$, $C_4F_9CH=CHCF_2CF_2Cl$, $(CF_3)_2CFCH=CHCF_2CFClCF_3$, $(CF_3)_2CFCH=CHCF_2CF_2Cl$, $C_2F_5CH=CHC_2F_5$, $C_2F_5CF=CHCFClCF_3$, $C_2F_5CF=CHCF_2CF_2Cl$, $C_2F_5CF=CHCFClCF_2Cl$, $C_3F_7CH=CCl CF_3$ and mixtures thereof. In some embodiments, the compound of formula (3) may be present in compositions further including $C_2F_5CF=CHCCl$ $(CF_3)CF_2CF_3$. $C_2F_5CF=CHCCl$ $(CF_3)CF_2CF_3$ can form as a result of the foregoing formulae (3) compounds reacting with a formulae (2) compound.

In some embodiments, the compound of formula (2) and the compound of formula (1) are contacted in amounts resulting in a molar ratio of 0.01:1 to 5:1. In one embodiment, the compound of formula (2) and the compound of formula (1) are contacted in amounts resulting in a molar ratio of (2):(1) of 0.1:1 to 2:1. In one embodiment, the compound of formula (2) and the compound of formula (1) are contacted in amounts resulting in a molar ratio of (2):(1) of 1:1 to 2:1. In an embodiment, the compound of formula (2) is (TFE) and the compound of formula (1) is $CF_3CH=CFCF_3$ (HFO-1327).

The reaction is may be conducted in a closed system under atmospheric or elevated pressure. The catalyst is preferably a Lewis acid including, for example, at least one of aluminum chloride, antimony chlorides, among others. In some embodiments, the Lewis acid is a strong Lewis acid. In one embodiment, the catalyst is at least one of antimony pentafluoride ($SbF_5$), or aluminum chlorofluoride $AlCl_xF_{3-x}$ or aluminum bromofluoride $AlBr_xF_{3-x}$ In some embodiments, x may be an integer from 1 to 3. In some embodiments, x may be 0.01 to 0.5. While any suitable amount of catalyst can be employed, the amount can range from about 0.5 to about 20 mol %, about 1 to about 15 mole % and, in some cases, about 5 to 10 mole % of the formulae (1) and formulae (2) compounds.

Additional suitable strong Lewis acids may be found in (Chemical Reviews, 1996, v.96, pp. 3269-3301; a list of strong Lewis acids is given on page 3271), which is hereby incorporated by reference. In some embodiments, the reaction mixture is heated to a sub-ambient or ambient temperature. In some embodiments, the reaction mixture is heated to a temperature of −50° C. to 50° C. In one embodiment, the reaction mixture is heated to a temperature of −50° C. to 25° C. In some embodiments, the reaction is performed at a reactor pressure of 0.1 pound per square inch gauged (psig) to 300 pounds per square inch gauged (psig). In some embodiments, the reaction is performed under autogenic pressure.

In some embodiments, the formation of the compound of formula (3) may be conducted in the presence of a solvent.

In some embodiments, the solvent comprises at least one of the reaction product (e.g., at least one formulae (3) compound), at least one starting material (e.g., at least one of the formulae (1) or (2) compounds), or a perfluorinated saturated compound. In some embodiments, the perfluorinated saturated compound may include perfluoropentane, perfluorohexane, cyclic dimer of hexafluoropropene, (mixture of perfluoro-1,2- and perfluoro-1,3-dimethylcyclobutanes), and combinations thereof. The amount of solvent will vary as a function of the volume of the reactor as well as the ratios of formulae (1) and formulae (2) used to obtain formulae (3).

Compounds of formula (3) may be used in numerous applications for the transfer of heat, such as, heat transfer fluids. In one embodiment, the compounds of formula (3) may be used to transfer heat from an article. The article may be contacted with a heat transfer media including at least one compound of formula (3). The inventive composition can have a heat of vaporization ranging from about 80 to about 150 kjoules/kg, about 90 to about 140 and, in some cases, about 100 to about 130 kjoules/kg; when calculated using the Clausius Clapeyron equation.

The compounds of formula (3) may be used in various applications including as working fluids. Working fluids provide the medium to transport heat or produce power by mechanical means by expansion. Working fluids are typically in the liquid state at a first region. The working fluid absorbs heat in the first region, vaporizes, and migrates to a second region, having a lower temperature, where it condenses. The working fluid is typically returned to the first region after condensation allowing the heat transfer cycle to be repeated. Working fluids may be used in conjunction with compression, expansion systems, pumps or in passive evaporative cooling such as heat pipes or thermosyphons.

The compounds of formula (3) may also be used as solvents in various applications such as for cleaning (vapor degreasing, flux removal) or as a carrier fluid for the deposition or removal of soluble compounds.

During use, the working fluid in a first region is exposed to an elevated (first) temperature causing the working fluid to vaporize, thus absorbing thermal energy. The vaporized working fluid migrates to a second region, which is at a lower (second) temperature than the first region. The working fluid condenses in the second region, releasing the thermal energy, which is transported external to the system. The working fluid is subsequently returned to the first region. The working fluid typically cyclically moves between the first region and the second region, transporting thermal energy between the first region and the second region.

Working fluids are selected to undergo a phase transition from the liquid to the gaseous state over the desired operational temperature range of a system, such as a heat pipe or thermosyphon. In some embodiments, the composition of the working fluids includes one or more compounds of formula (3). In some embodiments, the working fluids include one or more of 151-12mcyE, HFO-153-10mczz, HFO-153-10mzz, HFO-153-10mzzy, 151-12mcyZ, $CF_3CH=CHCF_2CF_2Cl$, $CF_3CH=CHCF_2CF_2CF_2Cl$, $CF_3CH=CHCF_2CFClCF_3$, $CF_3CH=CHCFClCF_3$, 153-10ze, R-1214xbE, F1214YA, $C_2F_5CH=CFC_2F_5$, $BrCF_2CF_2CH=CH_2$, R-1214xbZ, or R-1233yd(Z). In some embodiments, the operational temperature is at least 0° C., at least 10° C., at least 20° C., at least 30° C., at least 40° C., at least 50° C., less than 75° C., less than 70° C., less than 65° C., less than 60° C., less than 55° C., and combinations thereof.

The ability of the working fluid to transport heat is related to the heat of vaporization of the working fluids. The greater the heat of vaporization of the working fluids the greater amount of energy that the working fluid will absorb during vaporization and transport across the heat pipe to be released during condensation. In some embodiments, the compounds of formula (3) may exhibit a heat of vaporization of at least about 80 kilojoules per kg.

Working fluids may also be selected based at least partially on additional material properties. As the working fluids condense and return to the first region workings fluids having a lower viscosity more easily flow between the regions. In some embodiments, the compounds of formula (3) may exhibit a viscosity less than water of the same temperature, over the operational temperature range. In some embodiments, the compounds of formula (3) exhibit a viscosity of less than 0.5 centipoise at 55° C. The inventive composition can have a dynamic viscosity at a temperature of 55° C. ranging from about 0.001 to about 3 centipoise, about 0.1 to about 2 and, in some cases, about 0.15 to about 1.5, when determined by ASTM D445.

Compounds of formula (3) as working fluids for heat transfer applications may be selected based at least partially on the surface tension exhibited by the materials. For example, in heat pipe applications working fluids exhibiting high surface tensions may be more easily transported between the hot region and the cool region. In some embodiments, the selection of the wick materials may enhance the rate at which the condensed working fluid is returned to the hot region of the heat pipe. In some embodiments, the working fluids may exhibit a surface tension less than water of the same temperature, over the operational temperature range. In some embodiments, the compounds of formula (3) exhibit a surface tension of less than 64.5 dyne/cm at 70° C., less than 66.3 dyne/cm at 60° C., and/or less than 67.9 dyne/cm at 50° C.

The working fluids may also be selected based at least partially on other thermodynamic properties of the materials. Working fluids exhibiting a lower specific heat and/or a lower thermal conductivity than water at the same temperature may enhance energy transport between the hot region and the cool region of a heat pipe. In some embodiments, the working fluids may exhibit a specific heat of less than about 4.2 joules per gram Kelvin degree. In some embodiments, the compounds of formula (3) may exhibit a thermal conductivity of less than about 0.6 watts per meter Kelvin degree at 20° C.

The working fluids may also be selected to exhibit a dielectric constant suitable for electrical applications. In general, materials exhibiting a low dielectric constant provide increased electrical isolation of the electrical components immersed therein. Examples of such electrical components include, for example, automotive batteries, computers, and servers wherein the dielectric constant is less than about 2.5. In some embodiments, the dielectric constant of the working fluids is less than about 8 over the operational frequency range (0 to 20 GHz). Suitable dielectric working fluids include compounds of formula (3) and their mixtures having a dielectric constant over the operational frequency range (0 to 20 GHz) of less than 7.3, or less than 5.5, or less than 5.0, or less than 4.0, or less than 3.5, or less than 2.7, or less than 2.5, or less than 2.0, or less than 1.9, or less than 1.8, or less than 1.5. Other embodiments include compounds and mixtures having a dielectric constant greater than about 1.0 and less than about 8.0, or greater than about 2.0 and less than about 7.3, or greater than about 2.5 and less than about 5.5, or greater than about 3.5 and less than about 5.0.

Examples of compounds of formula (3) are shown in Table 1.

TABLE 1

| Fluid | method = basis set = dipole moment (Debye) | MP2 6-311G (d, p) Polarizability (Bohr ^ 3) | liquid at 25° C. rho_1 (g/cm3) | dielectric constant |
|---|---|---|---|---|
| E-$C_2F_5CF$=$CFC_2F_5$ (FO-151-12mcyyE) | 0.00 | 63.27 | 1.64 | 1.75* |
| E-$C_2F_5CH$=CH $C_2F_5$ (HFO-153-10mczz) | 0.10 | 62.74 | 1.52 | 1.82* |
| E-$C_2F_5CH$=$CHCF_3$ (HFO-1438mzz) | 0.0789 | 52.19 | 1.42 | 1.83* |
| $C_3F_7CH$=$CHCF_3$ (HFO-153-10mzz) | 0.24 | 62.81 | 1.51 | 2.09* |
| $(CF_3)_2CFCH$=$CHCF_3$ (HFO-153-10mzzy) | 0.20 | 62.66 | 1.49 | 1.85* |
| $CF_3CH$=$CHCF_2CF_2Cl$ | 0.84 | 71.90 | 1.53 | 1.94** |
| $CF_3CH$=$CHCF_2CFClCF_3$ | 0.59 | 72.14 | 1.74 | 2.09** |
| $CF_3CH$=$CHCFClCF_3$ | 0.68 | 61.66 | 1.57 | 2.28** |
| $C_4F_9CH$=CFH (HFO-153-10ze) | 1.48 | 63.26 | 1.55 | 3.77* |
| E-$CF_3CCl$=CFCl (CFO-1214xbE) | 0.98 | 50.72 | 1.53 | 2.67** |
| $CF_3CF$=$CCl_2$ (CFO-1214ya) | 1.26 | 50.90 | 1.53 | 3.42** |
| $C_2F_5CH$=$CFC_2F_5$ (HFO-152-11mcyz) | 1.41 | 62.88 | 1.61 | 3.46** |
| $BrCF_2CF_2CH$=$CH_2$ | 2.16 | 57.52 | 1.73 | 4.81** |
| Z-$CF_3CCl$=CFCl (CFO-1214xbZ) | 1.78 | 50.30 | 1.53 | 5.45** |
| Z-$HCF_2CF$=CHCl (HCFO-1233ydZ) | 1.74 | 41.37 | 1.32 | 7.28** |
| Z-$C_2F_5CF$=$CFC_2F_5$ (FO-151-12mcyZ) | 0.43 | 63.45 | 1.64 | 1.59** |
| $CF_3CH$=$CHCF_2CF_2Cl$ | 0.59 | 60.85 | 1.49 | 1.74** |

*measured using ASTM D924
**calculated using conventional methods known in the art.

Additional additives may be added to the working fluid. Suitable additives include linear hydrocarbons, linear halocarbons, cyclic hydrocarbons, cyclic halocarbons, heptafluorocyclopentane, alcohols (e.g., methanol, ethanol, isopropanol), ethers, halogenated ethers, ketones, and halogenated ketones. Examples of suitable additives include pentane (bp 36° C.), hexane (bp 69° C.), heptane (bp 98° C.), octane (bp 125° C.), cyclopentane (49° C.), cyclohexane (80° C.), cycloheptane (118° C.), methyl cyclobutane (39° C.), methylcyclopentane (72° C.), diethyl ether (35° C.), diisopropyl ether (bp 69 C), $C_4F_9OCH_3$ (CAS 163702-07-6), $C_4F_9OCH_2CH_3$ (CAS 163702-05-4); i-$C_4F_9OCH_2CH_3$ (CAS 163702-06-5), $(CF_3)_2CFCF(OCH_3)CF_2CF_3$ (73DE, CAS 132182-92-4), $C_3F_7OCH_3$ (CAS 375-03-1), $(CF_3)_2CFCF(OCH_2CH_3)CF_2CF_3$ (HFE 7500, CAS 297730-93-9), 1,1,1,2,3,3-hexafluoro-4-(1,1,2,3,3,3-hexafluoropropoxy)pentane (HFE 7600,CAS 870778-34-0), Furan, 2,3,3,4,4-pentafluorotetrahydro-5-methoxy-2,5-bis[1,2,2,2-tetrafluoro-1-(trifluoromethyl)ethyl]-(HFE 7700), [CAS 812-05-4], and 1,1,1,2,4,4,5,5,5-nonafluoro-(2-trifluoromethyl)-3-pentanone (Novec 1230, CAS 756-13-8). These additives typically have a GWP greater than the inventive formulae (3) compounds and formulae (3) containing compositions. The amount of the additives will vary depending upon the desired GWP of the working fluid.

While the inventive composition can be used as a dielectric working fluid in any suitable immersion cooling system, one suitable immersion cooling system is illustrated in FIG. 1. Referring now to FIG. 1, FIG. 1 illustrates an immersion cooling unit 100 is shown in FIG. 1. The immersion cooling system 100 includes an immersion cell 110 defining an internal cavity 120. An electronic component 130, to be cooled, may be placed in the internal cavity 120. The inventive dielectric working fluid 140 is supplied to and partially fills the internal cavity 120. The dielectric working fluid 140 at least partially immerses the electronic component 130. In some embodiments, the dielectric working fluid 140 substantially immerses the electronic component 130. In one embodiment, the dielectric working fluid 140 completely immerses the electronic component 130. A condensing coil 150 is additionally present in the internal cavity 120. The condensing coil 150 may be spatially located above at least a portion of the dielectric working fluid 140.

During operation, heat generated by the electrical component 130, heats the dielectric working fluid 140 causing a portion of the dielectric working fluid 140 to vaporize. The dielectric working fluid 140 vapors contact the condensing coil 150 above the dielectric working fluid 140 and transfer thermal energy to the condensing coil 150 allowing the condensate dielectric working fluid 140 to precipitate into the dielectric working fluid 140 below. The thermal energy transferred to the condensing coil 150 is transported external to the immersion cell 110 and released into the environment via a heat exchanger 160.

The following Examples are provided to illustrate certain aspects of the invention and shall not limit the scope of the appended claims.

EXAMPLES

Exemplary examples of the formation of compounds of formula (3) are shown below.

Example 1

Reaction of HFO-1327 With Tetrafluoroethylene (TFE) Catalyzed by SbF5

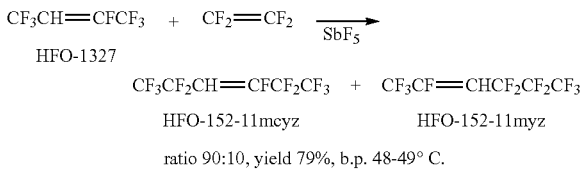

A 400 ml Hastelloy shaker tube was loaded with 10 g (0.046 mol) of $SbF_5$, shaker tube was cooled down in dry ice, evacuated and charged with 65 g (0.36 mol) of HFO-1327 ($CF_3CH$=$CFCF_3$) and 40 g (0.4 mol) of tetrafluoroethylene (TFE). It was placed in a barricade and was warmed up to ambient temperature and kept agitated for 16 hours. 100 ml of water was injected into shaker tube, it was cooled down with ice, vented off and unloaded. Organic layer was separated, dried over $MgSO_4$ and filtered to give 102 g of crude product, which was fractionated to give 80 g (79% yield) of fraction b.p. 47-48° C., which was identified as a mixture of $CF_3CF_2CF$=$CHCF_2CF_3$ and $CF_3CF$=$CHCF_2CF_3$ in ratio 90:10 (purity of this fraction was >99.5%).

$^1$H Nuclear Magnetic Resonance (NMR) (CDCl$_3$): 5.83 (dt, 29.3, 12.2 Hz) ppm
$^{19}$F NMR (CDCl$_3$): −83.96 (3F, td, 6.2, 2.1 Hz), −86.06 (3F, dt, 5.7, 2.0 Hz), −110.83(1F, m), −113.48 (2F, ddq, 22.9, 12, 2, 2.1 Hz), −122.75(2F, dq, 12.9, 2.0 Hz) ppm

E-CF$_3$CF=CHCF$_2$CF$_3$ $^{19}$F NMR (CDCl$_3$): −74.03 (3F, dt, 9.4,1.5 Hz), −80.64 (3F, t, 9.3 Hz), −110.78 (1F, m), −114.86 (2F, m), −128.06 (2F, d, 6.4 Hz) ppm
$^1$H NMR (CDCl$_3$): 6.74 (1H, m), 6.91 (1H, m) ppm
MS (m/z, mixture of isomers): 282 (M$^+$, C$_6$HF$_{11}{}^+$)

Example 2

Reaction of HFO-1327 With Chlorotrifluoroethylene Catalyzed by SbF$_5$

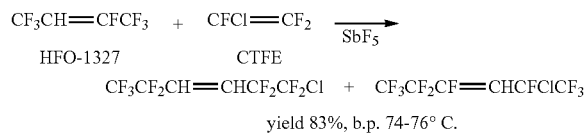

CF$_3$CH=CFCF$_3$ + CFCl=CF$_2$ →[SbF$_5$]
HFO-1327      CTFE

CF$_3$CF$_2$CH=CHCF$_2$CF$_2$Cl + CF$_3$CF$_2$CF=CHCFClCF$_3$ yield 83%, b.p. 74-76° C.

A 25 mL round-bottomed flask was charged with 5 g (0.023 mol) SbF$_5$ and equipped with dry ice condenser connected to cols trap (−78° C.), thermocouple well, gas inlet tube and magnetic stir bar. It was cooled down with wet ice and 10 g (0.055 mol) of CF$_3$CH=CFCF$_3$ was slowly added to the flask at +2-5° C. with vigorous agitation. Gaseous CFCl=CF$_2$ (chlorotrifluoroethylene, CTFE, 6 g, 0.051 mol) was slowly added to the reaction mixture over 30 min period and the reaction mixture was warmed up to ambient temperature overnight. Next morning the reaction flask was cooled down with wet ice and CTFE collected in cold trap was added to the reaction mixture and the reaction continued. Over 10 h temperature went up to 18° C. At this point the reaction mixture was dumped into 100 ml of iced water, organic layer was separated, washed with water, dried over MgSO$_4$ and filtered to give 20 g of the crude product which was fractionated to give 14 g (83% yield) of fraction b.p. 74-76° C., which was identified by NMR as a mixture of E-C$_2$F$_5$CH=CFCF$_2$CF$_2$Cl and E-C$_2$F$_5$CH=CFCFClCF$_3$ (ratio 51:49).

C$_2$F$_5$CH=CFCF$_2$CF$_2$Cl:

$^{19}$F NMR (CDCl$_3$): −70.78 (2F, m), −85.82 (3F (m), −108.68 (1F, m), −113.27 (2F, ddq, 23.0, 12.0, 2.3 Hz), −118.10(2F, dtt, 12.2, 5.0, 2.3 Hz) ppm
$^1$F NMR (CDCl$_3$): 5.7-6.0 (m) ppm C$_2$F$_5$CH=CFCFClCF$_3$:

$^{19}$F NMR (CDCl$_3$): −80.55 (3F, t, 7.5 Hz), −85.82 (3F, m), −104.99(1F, m), −113.02(1F, dq, 23.5, 10.8 Hz), −133.43 (1F, m) ppm
$^1$H NMR (CDCl$_3$): 5.7-6.0 (m) ppm
GC/MS (z/e, mixture of isomers): 298 (M$^+$, C$_6$HClF$_{10}{}^+$)

Example 3

Reaction of HFO-153-10mzzy (F13iE) With TFE Catalyzed by SbF$_5$

(CF$_3$)$_2$CFCHCH=CHCF$_3$ + CF$_2$=CF$_2$ →[SbF$_5$]
F13iE         TFE

-continued
(CF$_3$)$_2$CFCH=CHCF$_2$CF$_2$CF$_3$ + (CF$_3$)$_2$CFCH=CHCF(CF$_2$CF$_3$)$_2$
F33iE
yield 76%, b.p. 92-92.5° C.

A shaker tube (200 mL) was charged with 5 g (0.02 mol) of antimony pentafluoride (SbF$_5$, content of HF 1.4 mol %). The reaction vessel was cooled down with dry ice, evacuated and 95 g (0.36 mol) of (CF$_3$)$_2$CFCH=CHCF$_3$ (HFO-153-10mzzy) was added to the reactor, followed by 40 g (0.4 mol) of TFE. The reactor was kept at 20° C. for 12 h. A pressure drop (120 to 5 psi) occurred in first hour of the reaction, internal temperature spiked to 30° C.). The shaker tube was vented off, the liquid reaction mixture was transferred into glass jar. The reaction mixture was slowly poured into 500 ml of iced water (exothermic) to remove residual SbF$_5$, organic layer was separated, washed by water (100 mL×2) and dried over MgSO$_4$. The amount of HFO-153-10mzzy is in excess such that the HFO-153-10mzzy functions as a reactant as well as a solvent and thereby encourages formation of HFO-153-10mzzy. After filtration it was isolated 152 g of crude product. Crude material was analyzed by NMR and it was shown to contain small amount of HFO-153-10mzzy, (CF$_3$)$_2$CFCH=CHCF$_2$CF$_2$CF$_3$ and trace (CF$_3$)$_2$CFCH=CHCF(C$_2$F$_5$)$_2$ in ratio 23:76.9:0.1. Crude material was fractionated at atmospheric pressure to give 100 g (yield 76%) of E-(CF$_3$)$_2$CFCH=CHCF$_2$CF$_2$CF$_3$, b.p 92.2-92.5° C. (see Table 4), (~99% purity,). The pot residue (4 g) was found to be a mixture of (CF$_3$)$_2$CFCH=CHCF$_2$CF$_2$CF$_3$ and trace (CF$_3$)$_2$CFCH=CHCF(C$_2$F$_5$)$_2$ in ratio 85:15.

E-(CF$_3$)$_2$CFCH=CHCF$_2$CF$_2$CF$_3$:

$^{19}$F NMR (CDCl$_3$): −76.88 (6F, d, 6.8 Hz), −80.78 (3F, t, 9.0 Hz), −115.05 (2F, quint., 9.0 Hz), −128.01 (2F, s), −187.45 (1F, m) ppm.
$^1$H NMR (CDCl$_3$): 6.46 (m) ppm.
MS (m/z): 364 (M$^+$, C$_8$F$_{14}$H$_2{}^+$).

(CF$_3$)$_2$CFCH=CHCF(CF$_2$CF$_3$)$_2$:

$^{19}$F NMR (CDCl$_3$): −79.47 (6F, d, 6.7 Hz), −79.96 (6F, d, 11.6 Hz), −121.17 (2F, A:B quartet., 298 Hz), −122.23 (2F, A:B quartet, 298 Hz), −186.15 (1F, m), −187.47 (1F, m) ppm.
$^1$F NMR (CDCl$_3$): 6.38 (m) ppm.
GC/MS (m/z): 464 (M+, C$_{10}$F$_{18}$H$_2{}^+$).

Example 4

Reaction of HFO-1326 With Tetrafluoroethylene Catalyzed by SbF$_5$

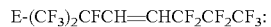

CF$_3$CCl=CHCF$_3$ + CF$_2$=CF$_2$ →[SbF$_5$]
HCFO-1326      TFE

CF$_3$CCl=CHCF$_2$C$_2$F$_5$ + C$_2$F$_5$(CF$_3$)CClCH=CFC$_2$F$_5$ yield 79%

A 400 ml Hastelloy R shaker tube was loaded with 6 g (0.028 mol) of SbF$_5$, shaker tube was cooled down in dry ice, evacuated and charged with 60 g (0.3 mol) of HCFO-1326 (CF$_3$CH=CClCF$_3$) and 50 g (0.5 mol) of tetrafluoroethylene (TFE). It was placed in a barricade and was warmed up to ambient temperature and kept agitated for 16 hour. 100 ml of water was injected into shaker tube, it was cooled down with ice, vented off and unloaded. Organic layer was separated, dried over $MgSO_4$ and filtered to give 85 g of crude product, containing 50% of HCFO-1326, 37% of $CF_3CCl=CHC_3F_7$ and 13% of 1:2 adduct of HCFO-1326/TFE (GC/MS).

Crude reaction mixture was fractionated to give 39 g (79% yield, at 50% conversion of HCFO-1326) of fraction b.p. 80-86° C., which was identified as a mixture of E-$CF_3CCl=CHCF_2CF_3$ and Z—$CF_3CCl=CHCF_2CF_3$ in ratio 65:35, along with 10 g of higher boiling point fraction (1:2 adduct, GC/MS).

E-$CF_3CCl=CHC_3F_7$:

$^{19}F$ NMR ($CDCl_3$): −70.98 (3F, s), −80.67 (3F, t, 8.9 Hz), −111.64(2F, sixt. 10.5 Hz), −127.16(2F, q, 4.0 Hz) ppm
$^1F$ NMR ($CDCl_3$): 6.59 (t, 12.3 Hz) ppm Z—$CF_3CCl=CHC_3F_7$:

$^{19}F$ NMR ($CDCl_3$): −63.64 (3F, tt, 17.7, 4.0 Hz), −80.52 (3F, t, 10.5), −107.20 (2F, m), −127.76 (2F, s) ppm $^1H$ NMR ($CDCl_3$):
$^1H$ NMR ($CDCl_3$): 6.41 (t, 14.5 Hz) ppm
GC/MS (m/z, mixture of isomers): 298 ($M^+$, $C_6HClF_{10}{}^+$)
1:2 Adduct —$C_2F_5CF=CHCCl(CF_3)CF_2CF_3$ (major isomer): b.p. 105-109° C. (est).
$^{19}F$ NMR ($CDCl_3$): −71.83 (3F, dm, 12.1 Hz), −78.24 (3F, m), −83.96, (3F, dt, 6.1, 1.8 Hz), −108.55(1F, m), −115.92 (2F, AB quart., $J_d$=296.7 Hz), −122.32 (2F, ddq, 13.0, 10.8, 2.1 Hz) ppm
$^1H$ NMR ($CDCl_3$): 5.84 (d, 27.6 Hz) ppm
GC/MS (m/z, mixture of isomers): 398 ($M^+$, $C_8HClF_{14}{}^+$)

Example 5

Reaction of $C_4F_9CH=CHCF_3$ ($F_{14}E$) With Chlorotrifluoroethylene (CTFE) Catalyzed by $SbF_5$ $C_4F_9CH=CHCF_3$ + $CFCl=CF_2$ $\xrightarrow{SbF_5}$
F14E          CTFE $C_4F_9CH=CHCFCFClCF_3$ + $C_4F_9CH=CHCFCF_2CF_2Cl$ yield 68%, b.p. 138-142° C.

A 50 mL round-bottomed flask was charged with 5 g (0.023 mol) $SbF_5$ and equipped with dry ice condenser, thermocouple well, gas inlet tube and magnetic stir bar. It was cooled down with wet ice and 23 g (0.073 mol) of $C_4F_9CH=CHCF_3$ was slowly added to the flask at +2-5° C. with vigorous agitation. Gaseous $CFCl=CF_2$ (chlorotrifluoroethylene, CTFE, 7 g, 0.06 mol) was slowly added to the reaction mixture over 30 min period and the reaction mixture was warmed up to ambient temperature over 3 h period. It was dumped into 100 ml of iced water, organic layer was separated, washed with water, dried over $MgSO_4$ and filtered. The crude product contained 33% of $C_4F_9CH=CHCF_3$ (conversion 67%) and 67% of product. It was fractionated to give 15 g (68% yield on converted $C_4F_9CH=CHCF_3$) of fraction b.p. 137-141° C., which was identified by NMR as a mixture of E-$C_4F_9CH=CHCF_2CF_2Cl$ and E-$C_4F_9CH=CHCF_2CFClCF_3$ (ratio 55:45).

E-$C_4F_9CH=CHCF_2CF_2Cl$:

$^{19}F$ NMR ($CDCl_3$): −67.05 (2F, t, 11.2 Hz), −81.06 (3F, m), −113.26 (2F, m), −114.08 (2F, m), −121.86 (2F, s), −124.25 (2F, m), −125.85 (2F, m) ppm
$^1H$ NMR ($CDCl_3$): 6.40-6.62 (m) ppm E-$C_4F_9CH=CHCF_2CFClCF_3$ $^{19}F$ NMR ($CDCl_3$): −76.81(3F, q, 9.7 Hz), −81.06 (3F, m), −109.61 (2F, q, 9.7 Hz), −114.08(2F, m), −121.86 (2F, s), −124.25 (2F, m), −125.85 (2F, m), −138.51 (1F, sixt., 7.5 Hz) ppm
$^1H$ NMR ($CDCl_3$): 6.40-6.62 (m) ppm
GC/MS (m/z, mixture of isomers): 430 ($M^+$, $C_9H_2ClF_{15}{}^+$)

Example 6

Reaction of $(CF_3)_2CF_2CH=CHCF_3$ With Chlorotrifluoroethylene Catalyzed by $SbF_5$ $(CF_3)_2CFCH=CHCF_3$ + $CFCl=CF_2$ $\xrightarrow{SbF_5}$
F13iE                    CTFE $(CF_3)_2CFCH=CHCF_2CF_2CF_2Cl$ + $(CF_3)_2CFCH=CHCF_2CFClCF_3$ yield 80%, b.p. 111-115° C.

The reaction of HFO-153-10mzzy (F13iE) and CTFE was carried out using the set up described in the previous experiment, using 5 g (0.023 mol) $SbF_5$ 30 g (0.11 mol) of HFO-153-10mzzy was slowly added to the flask at +2-5° C. with vigorous agitation. Gaseous $CFCl=CF_2$ (chlorotrifluoroethylene, CTFE, 13.5 g, 0.12 mol) was slowly added to the reaction mixture over 30 min period, while the temperature of the reaction mixture was maintained between 5-15° C. The reaction mixture was kept at ambient temperature for 3 h period. It was dumped into 100 ml of iced water, organic layer was separated, washed with water, dried over $MgSO_4$ and filtered. Crude reaction mixture was fractionated to give 25 g (80% yield) of fraction b.p. 111-115° C., identified by NMR and GC/MS as a mixture of $(CF_3)_2CFCH=CHCF_2CF_2CF_2Cl$ and $(CF_3)_2CFCH=CHCF_2CF_2ClCF_3$ in ratio 59:41.

$(CF_3)_2CFCH=CHCF_2CF_2CF_2Cl$:

$^{19}F$ NMR ($CDCl_3$): −67.54 (2F, t, 11.0 Hz), −76.54 (6F, m), −113.00 (2F, q, 10.3 Hz), −122.06 (2F, s), −187.19 (1F, m) ppm
$^1H$ NMR ($CDCl_3$): 6.4-6.6(m) ppm $(CF_3)_2CFCH=CHCF_2CFClCF_3$:

$^{19}F$ NMR ($CDCl_3$): −76.54 (6F, m), −76.95 (3F, m), −109.44 (2F, sixt., 10.4 Hz), −138.56 (1F, sixt., 7.6 Hz), −187.19 (1F, m) ppm
$^1H$ NMR ($CDCl_3$): 5.7-6.0 (m) ppm
GC/MS (z/e, mixture of isomers): 380 ($M^+$, $C_8H_2ClF_{13}{}^+$)

Example 7

Reaction of HFO-1438mzz (F12E) With CTFE Catalyzed by $SbF_5$ $C_2F_5CH=CHCF_3$ + $CFCl=CF_2$ $\xrightarrow{SbF_5}$
F12E          CTFE -continued

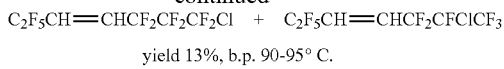

yield 13%, b.p. 90-95° C.

The reaction of HFO-1438mzz and CTFE was carried out sing set up described in previous experiment, using 5 g (0.023 mol) SbF$_5$ 30 g (0.14 mol) of HFO-1438mzz was slowly added to the flask at +2-5° C. with vigorous agitation. Gaseous CFCl=CF$_2$ (chlorotrifluoroethylene, CTFE, 16 g, 0.14 mol) was slowly added to the reaction mixture over 30 min period. The reaction mixture was left overnight. It was dumped into 100 ml of iced water, organic layer was separated, washed with water, dried over MgSO$_4$ and filtered. Crude reaction mixture (30 g) was fractionated to give 6 g (13% yield) of fraction b.p. 90-95° C., identified by NMR and GC/MS as a mixture of E-C$_2$F$_5$CH=CHCF$_2$CF$_2$CF$_2$Cl and E-C$_2$F$_5$CH=CHCF$_2$CF$_2$ClCF$_3$ in ratio 60:40.

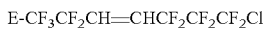

$^{19}$F NMR (CDCl$_3$): −67.35 (2F, t, 10.7 Hz), −84.96 (3F, m), −113.41 (2F, q, 10.7 Hz), −117.73 (2F, m), −121.97 (2F, s) ppm

$^{19}$F NMR (CDCl$_3$): −76.89 (3F, m), −84.96 (3F, m), −109.79 (2F, m), −117.73 (2F, m), −138.56 (1F, m) ppm
$^1$H NMR (CDCl$_3$, mixture of isomers): 6.37-6.64 (m) ppm
GC/MS (m/z, mixture of isomers): 330 (M$^+$, C$_7$H$_2$ClF$_{11}$$^+$)

Example 8

Reaction of HFO-1327 and CFCl=CFCl (CFO-1112) catalyzed by SbF$_5$

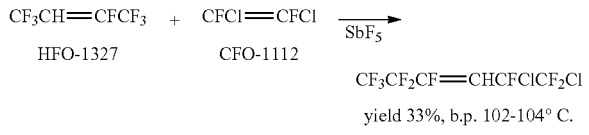

yield 33%, b.p. 102-104° C.

The reaction of HFO-1327 and CFCl=CFCl was carried out sing set up described in previous experiment, using 5 g (0.023 mol) SbF$_5$ and 20 g (0.11 mol) of CF$_3$CH=CFCF$_3$. CFO-1112 was slowly added to the reaction mixture at +2-5° C. with vigorous agitation over 30 min period. The reaction mixture was kept at 5-18° C. for 2 h. It was dumped into 100 ml of iced water, organic layer was separated, washed with water, dried over MgSO$_4$ and filtered. Crude reaction mixture (32 g) was fractionated to give 11 g (33% yield) of fraction b.p. 102-104° C., identified by NMR and GC/MS as a mixture of E-C$_2$F$_5$CF=CHCFClCF$_2$Cl.

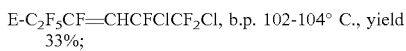

$^{19}$F NMR (CDCl$_3$): −65.69 (2F, AB q. 173.0 Hz), −85.74 (3F, dt, 5.6, 2.7 Hz), −103.66 (1F, m), −112.98 (2F, AB q., 278.8 Hz), −126.53 (1F, dt, 18.9, 10.5 Hz) ppm
$^1$H NMR (CDCl$_3$): 5.70 (dt, 30.4, 11.6 Hz) ppm
GC/Ms (m/z): 314 (M$^+$, C$_6$HCl$_2$F$_9$$^+$).

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A method of producing a fluoroolefin comprising: contacting a compound comprising formula (1), $$R_fCX_1=CHCF_3 \qquad (1)$$

wherein $R_f$ is a linear or branched $C_1$-$C_{10}$ perfluorinated or polyfluorinated alkyl group; and wherein X1 is H, Br, Cl, or F; wherein the compound of formula (1) comprises at least one member selected from the group consisting of $C_4F_9CH=CHCF_3$, $(CF_3)_2CFCH=CHCF_3$, $CF_3CH=CFCF_3$, and $CF_3CH=CClCF_3$; with a fluorinated ethylene compound comprising formula (2), $$CX_2X_3=CX_4X_5 \qquad (2)$$

wherein $X_2$, $X_3$, $X_4$, and $X_5$ are each independently H, Br, Cl, or F; and wherein at least three of $X_2$, $X_3$, $X_4$, and $X_5$ are F; wherein the fluorinated ethylene of formula (2) comprises at least one of CFCl=CF$_2$; CFCl=CFCl, CFH=CF$_2$ (HFO-1123), CFH=CFH (HFO-1132, and CF$_2$=CH$_2$(VF$_2$); in the presence of a catalyst in an amount sufficient to form a composition comprising a compound of formula (3), $$R_f(CF_2)_nCX_6=CH(CF_2)_mCX_7X_8CFX_9X_{10} \qquad (3)$$

wherein n is an integer from 0 to 10; wherein m is an integer from 1 to 10; wherein $X_6$, $X_7$, $X_8$, $X_9$, and $X_{10}$ are each independently H, Cl, or F; and wherein the total number of each of H, Cl, and F represented by $X_6$, $X_7$, $X_8$, $X_9$, and $X_{10}$ is the same as the total number of each of H, Cl, and F provided by $X_1$, $X_2$, $X_3$, $X_4$, and $X_5$ in formulae (1) and (2), wherein the compound of formula (3) comprises at least one member selected from the group consisting of $C_4F_9CH=CHCF_2CFClCF_3$, $C_4F_9CH=CHCF_2CF_2Cl$, $(CF_3)_2CFCH=CHCF_2CFClCF_3$, $(CF_3)_2CFCH=CHCF_2CF_2Cl$, $C_2F_5CH=CHC_2F_5$, $C_2F_5CF=CHCFClCF_3$, $C_2F_5CF=CHCF_2CF_2Cl$, $C_3F_7CH=CClCF_3$ and $C_3F_7CH=CClCF_3$.

2. The method of claim 1 wherein:
$R_f$ is selected from the group consisting of CF$_3$, C$_2$F$_5$, C$_3$F$_7$, i-C$_3$F$_7$, C$_4$F$_9$, C$_5$F$_{11}$, i-C$_5$F$_{11}$, C$_6$F$_{13}$, and i-C$_6$F$_{13}$.

3. The method of claim 1, wherein the amount sufficient includes a molar ratio of fluoroethylene:the compound of formula (1) of 0.01:1 to 5:1.

4. The method of claim 3, wherein the amount sufficient includes a molar ratio of fluoroethylene:the compound of formula (1) of 0.1:1 to 2:1.

5. The method of claim 1, wherein the amount sufficient includes a molar ration of the compound of formula (2) and the compound of formula (1) of 0.01:1 to 5:1.

6. The method of claim 1, wherein the composition further includes a solvent.

7. The method of claim 6, wherein the solvent comprises a perfluorinated saturated compound.

8. The method of claim 7, wherein the perfluorinated saturated compound comprises at least one member selected from the group consisting of perfluoropentane, perfluorohexane, cyclic dimer of hexafluoropropene, (mixture of perfluoro-1,2- and perfluoro-1,3-dimethylcyclobutanes), and combinations thereof.

9. The method of claim 1 wherein:
the catalyst includes antimony pentafluoride ($SbF_5$) or a compound of formula (4),
$SbCl_xF_{5-x}$ wherein x=0.01 to 0.5.

10. The method of claim 9, wherein the catalyst comprises at least one member selected from the group consisting of aluminum chloride ($AlCl_3$), antimony pentafluoride ($SbF_5$), and aluminum chlorofluoride $AlCl_xF_{3-x}$.

11. The method of claim 1, wherein the contacting is performed at sub-ambient or ambient temperature.

12. The method of claim 1, wherein the reaction is conducted under autogenic pressure.

13. The method of claim 1, wherein the reaction is conducted at 0.1 to 300 psig.

14. The method of claim 1, wherein the reaction is conducted in a closed system.

15. The method of claim 1, wherein the contacting is performed at a temperature of −50° C. to 50° C.

* * * * *